United States Patent [19]
Heflin et al.

[11] Patent Number: 5,442,644
[45] Date of Patent: Aug. 15, 1995

[54] SYSTEM FOR SENSING THE STATE OF INTERCONNECTION POINTS

[75] Inventors: Daniel L. Heflin, Front Royal; Gary V. Layton, Sterling, both of Va.

[73] Assignee: Unisys Corporation, Blue Bell, Pa.

[21] Appl. No.: 84,108

[22] Filed: Jul. 1, 1993

[51] Int. Cl.[6] .............................................. G06F 11/00
[52] U.S. Cl. .............................. 395/184.01; 364/232.2; 364/DIG. 1; 395/280; 395/183.06; 395/500
[58] Field of Search ....................... 371/15.1, 16.2, 23; 364/232.3, 578; 395/500, 112

[56] References Cited

U.S. PATENT DOCUMENTS

| | | | |
|---|---|---|---|
| Re. 31,828 | 2/1985 | Raymond et al. | 371/20.1 |
| 4,216,539 | 8/1980 | Raymond et al. | 371/20.1 |
| 4,620,304 | 10/1986 | Faran, Jr. et al. | 371/20.1 |
| 4,626,996 | 12/1986 | Arlott . | |
| 4,635,218 | 1/1987 | Widdoes, Jr. | 371/20.1 |
| 4,782,440 | 11/1988 | Nomizu et al. | 364/200 |
| 4,891,773 | 1/1990 | Ooe et al. . | |
| 4,924,429 | 5/1990 | Kurashita et al. | 364/200 |
| 5,051,938 | 9/1991 | Hyduke | 364/900 |
| 5,172,377 | 12/1992 | Robinson et al. | 371/22.3 |
| 5,189,365 | 2/1993 | Ikeda et al. . | |
| 5,193,068 | 3/1993 | Britman | 371/23 |
| 5,331,571 | 7/1994 | Aronoff et al. | 371/22.1 |

FOREIGN PATENT DOCUMENTS 175459  7/1988  Japan ........................ H01L 23/52

*Primary Examiner*—Robert W. Beausoliel, Jr.
*Assistant Examiner*—Albert Décady
*Attorney, Agent, or Firm*—John B. Sowell; Mark T. Starr

[57] ABSTRACT

A system for sensing the state or condition of a very large number of interconnection points in real time in electrical context with other points in a system. The system has a plurality of multiple interconnect sense modules having a plurality of interconnection sensing points for coupling to other points in the system. The system further has a transmitter/receiver in the module for each interconnection point to be sensed. The system further has an address generator counter for generating a unique address at each transmitter/receiver during a unique time period identifying each transmitter/receiver. A logic controller is provided with inputs from each of the receivers of the transmitter/receiver for sensing the state of the receivers at its unique time period. An encoder is coupled to the output of the logic controller for generating information indicative of the interconnection of two interconnection points during each one of the unique time periods. The output of the encoder is coupled to a buffer. The buffer is coupled to a CPU and to the address counter for receiving information indicative of the connection between any interconnection point and any other interconnection point in real time.

14 Claims, 4 Drawing Sheets

SYSTEM FOR SENSING THE STATE OF INTERCONNECTION POINTS

BACKGROUND OF THE INVENTION

1. Field of the Invention

The present invention relates to test equipment and simulators. More particular, the present invention system relates to a novel, universal module used as a major component of a simulator or in test equipment.

2. Description of the Prior Art

Equipment used for testing printed circuit boards are known wherein probe points (or a bed of nails probe) are physically engaged with points to be tested on the printed circuit board to create electrical connections which are coupled to computerized test equipment. Such test equipment is capable of determining which points are connected to other points which may be compared with a predetermined format to determine if the circuit conforms to a predetermined design. This type of test equipment requires a large amount of computing power as the number of test points is increased. Beyond a few thousand points the time required for processing the data sensed becomes exponentially large. A printed circuit board with a thousand points presently requires minutes to process.

Simulators used for operations and/or maintenance of equipment are well known. Typical complex examples are aircraft and satellite communication equipment simulators which have a very large number of test interconnection points. Presently such complex equipments are provided with no more than several thousand test points, thus, even with large computing power computers a sequence of procedures of two thousand tests points now requires several minutes. If the equipment under test is in a static mode such testing can be accomplished, however, such prior art equipment is not capable of dynamic, real time simulation or tests.

Dynamic test equipment for semiconductor devices which provides emulation of inputs and sensing of the expected results is known. Such semiconductor test equipment processes known logic inputs and senses expected outputs and is not related to testing of interconnection points in real time (i.e., dynamic testing).

Accordingly, it would be desirable to provide a new and novel apparatus and method for testing printed circuit boards and harnesses and/or providing a simulator having a large number of test points.

SUMMARY OF THE INVENTION

It is a principle object of the present invention to provide a novel, universal multiple interconnect sensing module for use in testing equipment and/or simulators.

It is a principle object of the present invention to provide a novel sensing module and method of operation which provides a capability of sensing a very large number of interconnection points in a short period of time.

It is a principle object of the present invention to provide an apparatus and a method for sensing a very large number of interconnected points simultaneously and for constraining the data sensed so as to enhance the speed of operation of the CPU in processing the data.

It is a primary object of the present invention to provide apparatus and a method for sensing a very large number of interconnected points in less time than was heretofore possible.

It is a general object of the present invention to provide an apparatus and a method for sensing a very large number of interconnected points dynamically and for determining open, ground and/or other points of interconnection.

According to these and other objects to the present invention there is provided a system for simulating a piece of equipment and/or testing a piece of equipment having a plurality of interconnection points. The connection points to be tested are coupled to a novel module having a transmitter/receiver for each interconnection point. An address generator is coupled to each transmitter/receiver for generating an address signal at a unique time period associated with each transmitter/receiver. Logic control circuits are coupled to the output of each receiver of each transmitter/receiver for sensing the state of the receiver at each individual unique address time period. The logic control circuits constrain the information received from the receiver and generate an output coupled to an encoder which generates information indicative of all interconnections, opens and grounds during each unique time period. The address generator and the output of the encoder are coupled to a processor for assimilating connection information in real time.

DETAIL DESCRIPTION OF A PREFERRED EMBODIMENT

Figure 1:
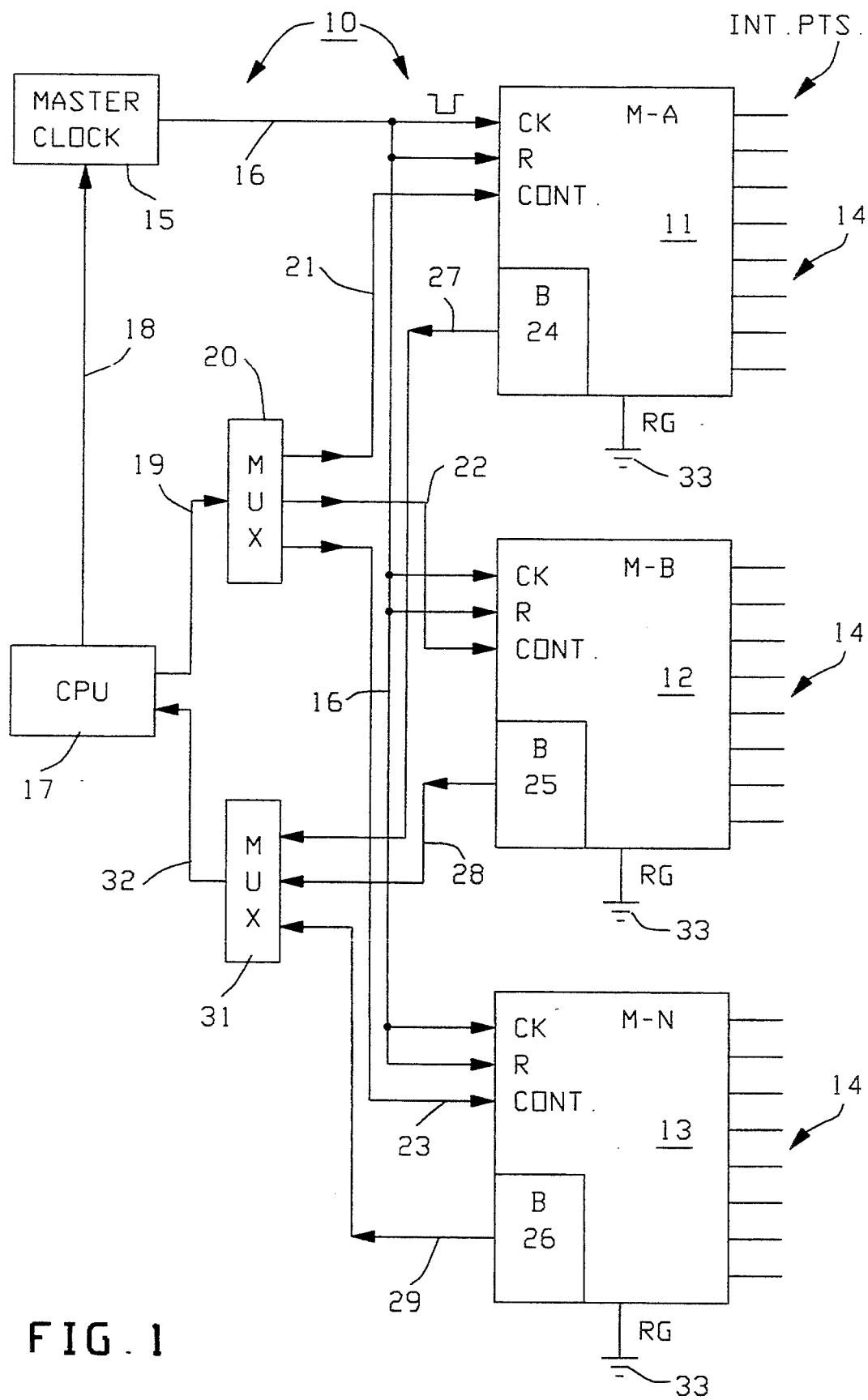
FIG. 1 is a schematic block diagram showing a systems level implementation of the present invention modules.

Refer now to FIG. 1 showing a schematic block diagram of a system 10 comprising a plurality of modules 11, 12 and 13 also labelled module A, B to N. Each of the modules is shown having a plurality of interconnection points shown at 14. At each of the interconnection points 14 there is provided a novel transmitter/receiver as will be explained in greater detail hereinafter. A master clock 15 is shown having a bus 16 which supplies each of the aforementioned modules 11, 12 and 13 with a clock input and a reset synchronization input. The system 10 is shown having a CPU 17 which is coupled to the master clock 15 by a control line 18. The CPU 17 is also shown having a control bus 19 which is coupled to a multiplexer 20 which has three output control lines 21, 22 and 23 going to each of the modules 11, 12, and 13 individually. As will be explained hereinafter the clock signal on bus 16 is processed inside the module and finally stored in the buffers shown at 24, 25 and 26 to provide outputs on lines 27, 28 and 29 that are applied to the multiplexer 31 and presented on bus 32 as an input to CPU 17. Each of the modules 11, 12 and 13 is shown connected to a real ground 33 for the system 10. In this context the real ground may be a systems ground but not a simulated ground.

Figure 2:
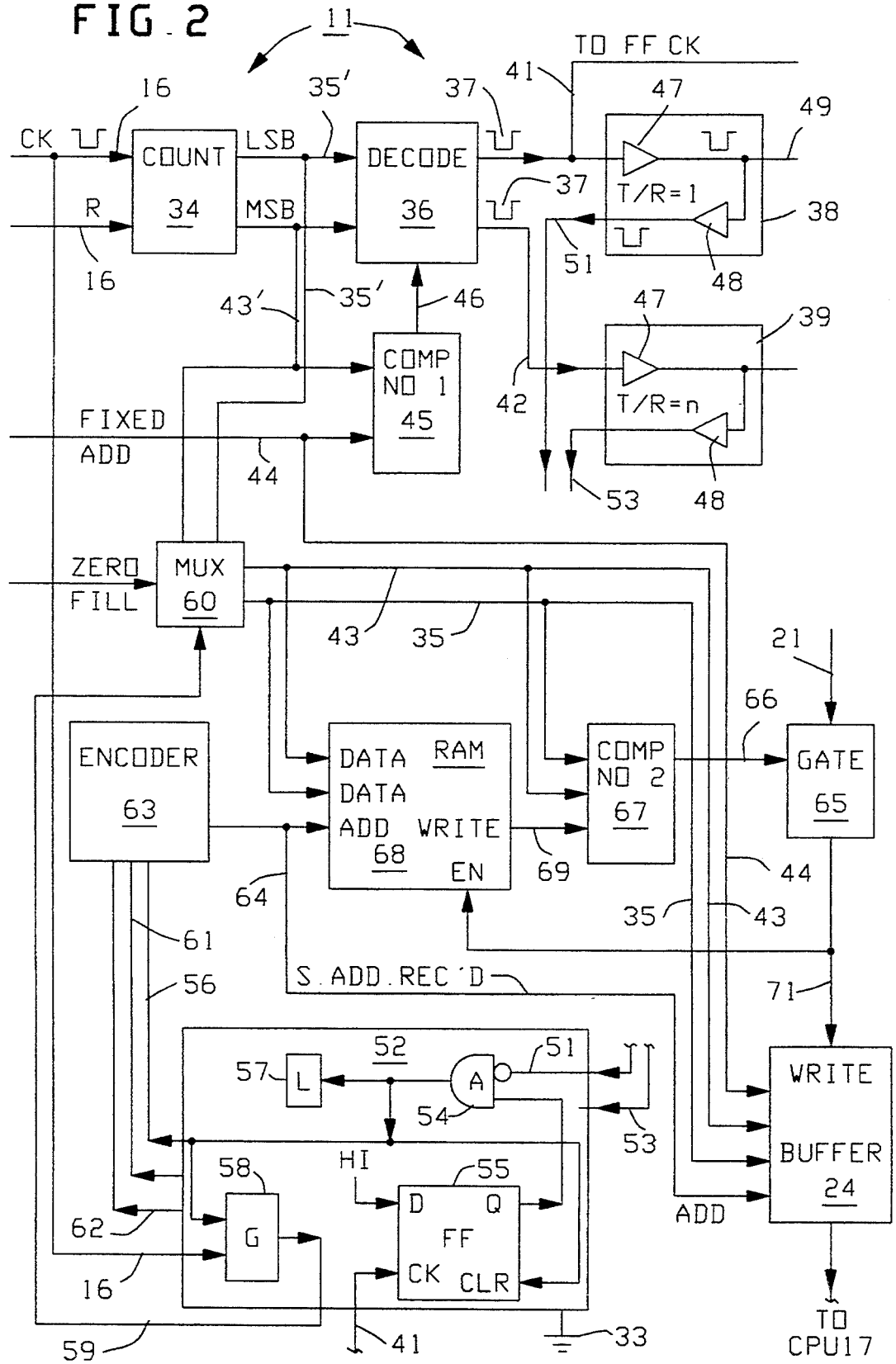
FIG. 2 is a detailed schematic block diagram of a preferred embodiment module of the type which is used for simulating a device under test, a piece of test equipment, a patch panel or an actual piece of test equipment.

Refer now to FIG. 2 showing a detailed schematic block diagram of a preferred embodiment module 11 which in all ways is the same as other modules in the system. Thus, the clock and reset synchronization input shown on line 16 to the address counter 34 will maintain each of the address counts of counter 34 on each of the modules in synchronization. The address counter 34 produces a plurality of addresses on the least significant bit (LSB) line 35' which is coupled to a decoder 36 which produces unique sense pulses 37, one for each of the transmitter/receivers 38, 39 etc. Stated differently, the sense pulses 37 are separated in time one from the other and each of the pulses is unique to only one transmitter/receiver throughout the system even though there may be over 32,000 transmitter/receivers for interconnection points in the system 10. The sense pulses 37 are shown on sense pulse lines 41, 42, etc. entering the transmitter/receivers 38, 39 and providing a discontinued output which will be connected to a flipflop in the logic means to be explained in detail hereinafter.

Counter 34 is shown having an output line 43 with a plurality of most significant bits (MSB) which are used to define the address of the individual modules 11, 12, 13 etc. as distinguished from the address of the transmitter/receivers. Each of the individual modules like module 11 is provided with a fixed address on their line 44 which is unique to each individual module. The line 44 address is shown as an input to comparator number 1 along with the most significant bit module address on line 43'. When a comparison is made between the two addresses in comparator 45 an enable signal is produced on line 46 to decoder 36. Thus, it will be understood that no signals 37 will appear on the output lines 41, 42 unless they are timed in the proper time division for the modules for which they are to be applied. Each the transmitter/receivers 38, 39, etc. is shown having an individual driver transmitter 47 and a receiver amplifier 48. In the preferred embodiment of the present invention the driver transmitter is implemented as an open collector circuit so that a plurality of drivers 47 may be connected to each other without damage as occurs with other type driver devices. Thus, when a plurality of transmitter/receivers are connected together the signal at each receiver comprises a hard wired AND connection of all the transmitted signals. When the sense pulse 37 on line 41 goes from high to low, the output on line 49 from transmitter amplifier 47 is coupled as an input to the receiver amplifier 48 to produce an amplified signal on line 51 which is coupled as an input to logic control means 52. Each of the receivers at the interconnection points generates a signal on its line 51, 53, etc. which is applied to an unique AND gate 54 in logic 52 for each of the receivers. The signal on line 41 is shown applied to a flipflop 55 at its clock input. The flipflop 55 is shown tied to a high logic level at its data input and having a Q output coupled to the individual AND gate 54 to produce a constrained receive signal on line 56.

The first constraining means comprises the unique pulse 37 on line 41 which clocks flip-flop 55 of logic control means 52 causing the Q output of said flip-flop 55 to go from a cleared state to a high logic level. The Q output and the received signal on line 51 are coupled to gate 54. The received signal on line 51 can not pass through the gate 54 until after the Q output of flip-flop 55 is a high logic level. Thus, any pulse raised on signal line 51 prior to the Q output of flip-flop 55 going high are constrained. Since the Q output of the flip-flop 55 is clocked by line 41, it can be seen that the constrained signal on line 56 is constrained to pulses which occur after the unique time period of its associated transmitter 47. The constrained signal on line 56 is also used to set a latch 57 for each of the receiver inputs. Thus, after sequencing through all of the transmitter/receivers in all of the modules it is possible to scan the latches 57 to determine if any latch 57 has not been properly set. If the latch 57 is not set, this is indicative of an open circuit for the receiver and its associated interconnection point. The output on line 56 is also coupled back and applied as a clear input to the flipflop 55.

The first constrained received data on line 56 is further constrained. When the first received pulse on line 56 occurs, the flip-flop 55 is cleared forcing a low logic level at the Q output which is coupled to the gate 54. It can be seen that no further pulses will pass through gate 54 during this unique address cycle. Therefore, a second constraining means blocks subsequent received pulses after the first interconnection pulse on line 56 occurs for the remainder of any unique address cycle. Further, the output on line 56 is applied to a ground sensing gate 58 along with the clock signal on line 16 to produce an output signal on line 59. If the two inputs on lines 16 and 56 do not coincide, because the signal on line 56 does not return to low, this is indicative of a ground condition, thus, gate 58 operates as a ground sense circuit. The output of gate 58 on line 59 is coupled as a control input to MUX 60 for selecting the inputs 35, 43 as the address data output to RAM 68. During normal operation, the outputs 35, 43 presents the transmitter/receiver address to RAM 68, however, when gate 58 senses a ground condition an alternate address is presented on lines 35, 43 shown in this preferred embodiment to be all zeros.

Each of the receivers in the transmitter/receivers 38, 39 produce outputs from the logic control means 52 on lines 56, 61, 62 which are coupled to the lowest address first address encoder 63. The encoder 63 produces addresses indicative of the transmitter/receivers on its module which have received the signals on the input lines 56, 61, 62, etc. The sensed addresses received on line 64 are applied as data to the buffer 24 of module 11. Buffer 24 is coupled via line 27 to the CPU 17 as explained with regards to FIG. 1. The control line 21 from the mux 20 is shown as an input to gate 65 which has a second input 66 from the second comparator 67. The counter 34 is shown having its output lines 35' and 43' coupled via MUX 60 to the input of RAM 68 to read data which is recorded in the RAM. The data is indicative of the address of the transmitter/receiver 38, 39 which has its driver 47 creating the sense pulse 37 at a particular instance in time. The data written into the RAM 68 is read out on line 69 as an input to comparator 67. The data output on line 69 is previous data and is compared with the new data on lines 35 and 43 at comparator 67. In order to properly sequence the old data from the RAM 68 with the new data being applied to comparator 67, a write enable signal on line 71 from the gate 65 is coupled back to the RAM 68 and applied as a write enable to the buffer 24.

The RAM 68, comparator 67 and gate 65 comprises a third constraining means (or gating means) by providing a change of state detector. The RAM 68 is addressed by the output on line 64 of the encoder means 63. The RAM 68 stores one value for each of the unique transmitter/receivers of the module. The data inputs into the RAM 68 comprises the MSBs 43 and LSBs 35 from counter 34. It can be seen that when the encoder 63 addresses the RAM 68, the value on the MSB line 43 and LSB line 35 during that unique time period represent the unique address of the interconnection point of the active transmitter/receiver. When the value peviously stored in RAM 68 differs from the present value presented to comparator 67, the present value is stored in buffer 24 and also written into RAM 68 under control of line 71 from gate 65. The present value information stored in buffer 24 is now available to CPU 17 via line 27. The preferred embodiment logic writes the four inputs 35, 43, 44, 64 shown on the left of buffer 24 into the buffer 24 when the comparator 67 indicates any inequality on line 66. Further, an override pulse on control line 21 to gate 65 can force the buffer 24 to write in all input data as distinguished from writing only the changes. As will be explained in greater detail hereinafter, by only writing the changes into the buffer 24, the logic constrains the data which is processed by the CPU 17.

Figure 3:
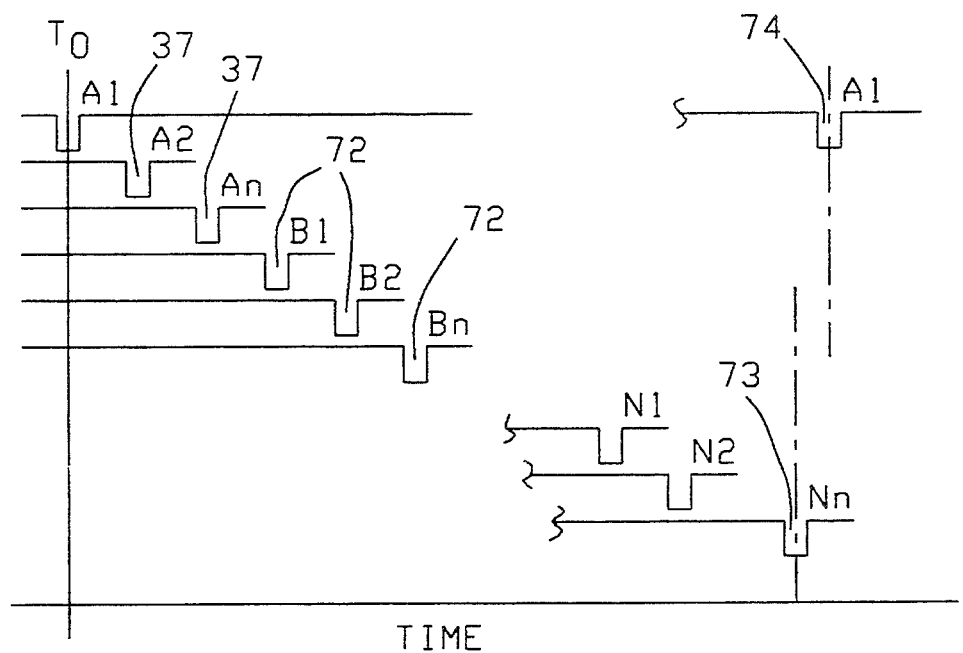
FIG. 3 is a timing diagram illustrating a unique timed division for each interconnection point address in the system.

Refer now to FIG. 3 showing a simplified timing diagram illustrating a unique time division for each of the interconnection points in the transmitter/receivers shown as 38 and 39 in FIG. 2. If A is employed to represent a module, then A1 and A2 and $A_n$ represent the time division of the sense pulses 37 for the module A. In similar manner the sense pulses 72 are indicative of a module B which has transmitter/receivers B1, B2, up to $B_n$. In a preferred embodiment of the present invention the last module N has transmitter/receivers N1, N2 up to $N_n$. The sense pulse 73 for $N_n$ is shown occurring one clock pulse before the next sequence of pulses for all of the transmitter/receivers to start anew as shown at the first sense pulse 74 of the new sequence A1. In the preferred embodiment of the present invention 16 transmitter/receivers were provided on a preferred embodiment module and 2,048 modules were provided to produce over 32,000 transmitter/receivers indicative of interconnection points. Further, in the preferred embodiment of the present invention the aforementioned master clock 15 was cycled at 1.33 megahertz to produce a complete cycle of 32,000 interconnecting points in 1/40th of one second.

As a further explanation, when connecting two interconnecting points manually, the time for stabilizing a connection has been estimated to be 20 milliseconds. Thus, a 1/40th of 1 second sample rate insures stable sensing of all points. During this 1/40th of 1 second all 32 thousand interconnection points are scanned in real time.

Figure 4:
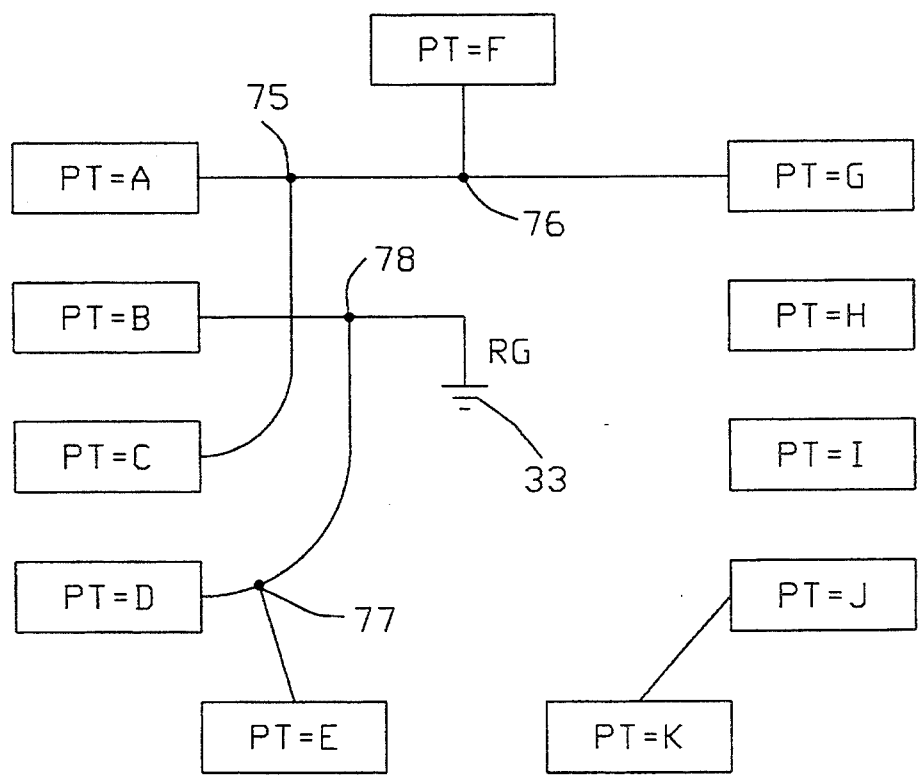
FIG. 4 is a schematic block diagram illustrating connections of typical interconnecting points in a system.

Refer now to FIG. 4 showing a schematic block diagram illustrating connections of typical interconnection points in a system. For purposes of a simplified explanation the interconnection points are numbered as alphabetic characters A through K. The modules in FIGS. 1 and 3 were also designated by alphabetic characters but do not correspond. The alphabetic characters in FIG. 4 correspond to addresses of interconnection points like the points 14 shown on FIG. 1. Since the point A is representative of transmitter/receiver 38 shown in FIG. 2, the point A has its transmitter connected to its receiver. Thus, point A is connected to point A. In a similar manner point A is also connected to point C through node 75. Similarly point A is connected to points F and G through node 76 in a similar manner point B is connected to point B and to points D and E through node 77. Point B is also connected to real ground through node 78. As will be explained hereinafter any time a real ground is connected to a point it over rides the address of the other interconnecting points in a constrained basis. Further, point K is shown connected to point J. All of the non constrained interconnections are shown in Table 1. Ordinarily all of this information would be processed by the CPU 17. To algebraically reduce the interconnection to the constrained values shown in Table 2, the before mentioned logic control means 52 etc. forms the constraints logically without burdening the computer 17 to perform the constrained basis and final solution shown in Table 2.

TABLE 1

| NON CONSTRAINED BASIS | | | |
|---|---|---|---|
| A = A | C = A | F = A | G = A |
| A = C | C = C | F = C | G = C |
| A = F | C = F | F = F | G = F |
| A = G | C = G | F = G | G = G |
| B = B | D = B | E = B | RG = B |
| B = D | D = D | E = D | RG = D |
| B = E | D = E | E = E | RG = E |
| B = RG | D = RG | E = RG | RG = RG |
| J = J | K = J | H = H | |
| J = K | K = K | I = I | |

TABLE 2

| CONSTRAINED BASIS | | |
|---|---|---|
| A = C | C = F | F = G |
| B = RG | D = RG | E = RG |
| J = K | | |

Figure 5:
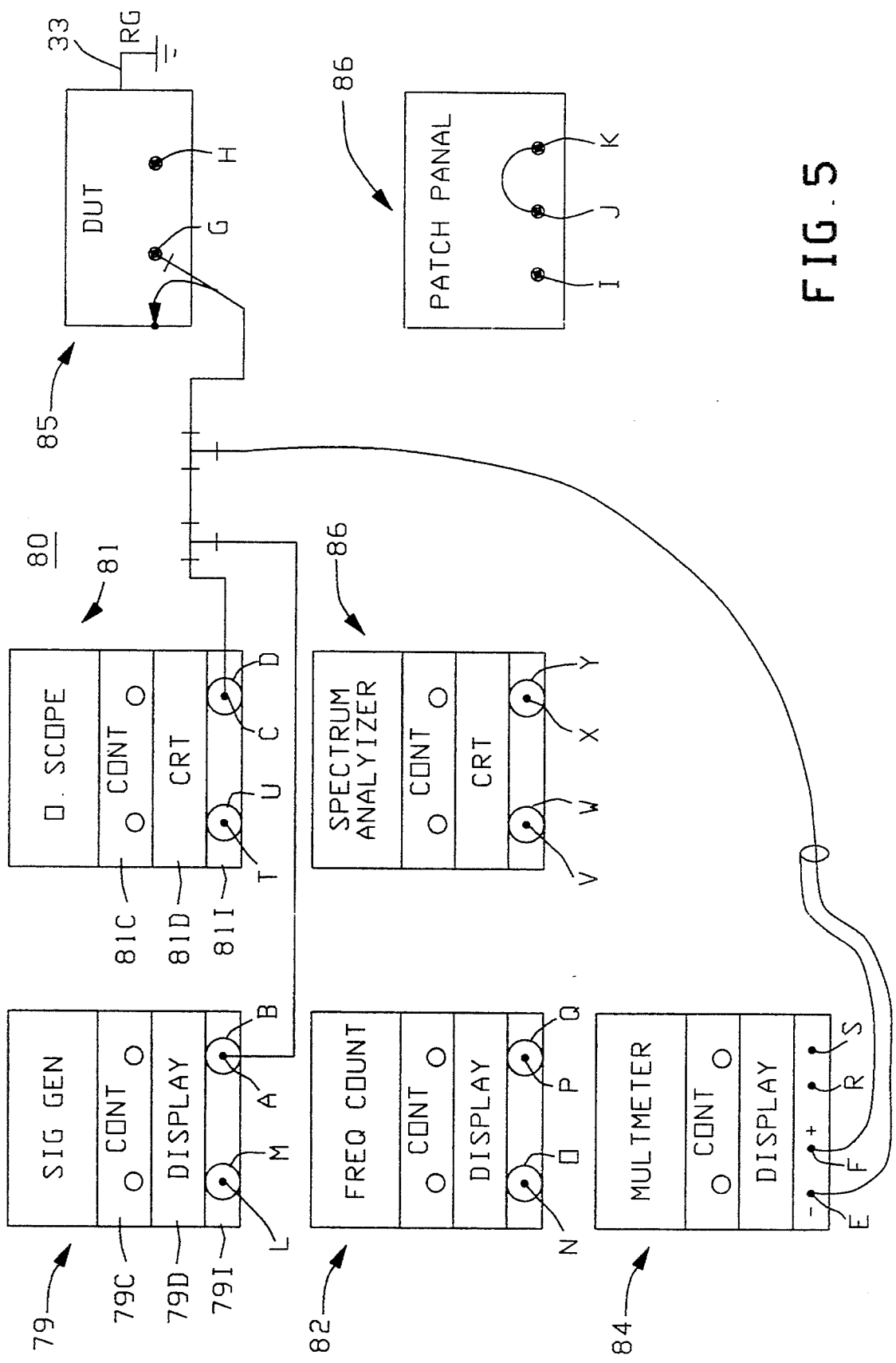
FIG. 5 is a schematic block diagram showing a simulator for test equipment as well as devices under test having the same interconnection points as in FIG. 4.

Before explaining FIG. 5 it will be noted that had the interconnection point G been disconnected from the device under test (DUT) that the previous equality F equals G shown in Table 2 would now indicate that F equals no connections, the same as H and I. Refer now to FIG. 5 showing a schematic block diagram of a simulator for test equipment as well as a device under test 85 having this same interconnecting points as shown in FIG. 4. The simulator 80 shown in FIG. 5 comprises a simulated signal generator 79 having a control panel 79C, a display panel 79D and a interconnection connector panel 79I.

In similar manner there is shown a simulated oscilloscope 81 having a control panel 81C, a CRT display panel 81D and an interconnect connector panel 81I. In the preferred embodiment simulator 80 there is provided a simulated frequency counter 82, a simulated spectrum analyzer 83 and a simulated multimeter 84. Each having its own control, display and interconnection panels. A part of the complete simulated system also includes a simulated device under test 85 and a simulated patch panel 86 both of which are provided with interconnection points shown as G through K which coincides with the interconnection points shown in FIG. 4.

Having explained how the novel module 11 shown in FIG. 2 generates a constrained algebraic input to the CPU 17 corresponding to the sensed interconnection state of the system, it will be appreciated that any number of interconnection points up to and in excess of 32,000 may be provided in the system for sensing interconnection points without over burdening the computer 17 so that a very large number of interconnection points in a simulator may be sensed in a real-time system. As an example, a standard clone PC employing a 486 Intel chip and a 33 megahertz clock is capable of handling all of the data in 1/40th of a second for more than 32,000 interconnection points. Thus, it will be appreciated that the time for sensing and assimilating the interconnection points for final result can easily be accomplished much faster than a human operator can change a probe point. Without the constrained basis of the novel module 11, the computer 17 would be required to sort through and assimilate 32,000 interconnection points in 1/40th of second. However, with the constrained basis the computer 17 only has to assimilate and correlate information from the changed points.

Another feature of the present invention enables almost any complex system to be simulated for training purposes. For example, each of the simulated pieces of equipment 79 through 84 shown in FIG. 5 may be simulated by placing the modules shown in FIG. 2 behind the simulated equipment to provided the desired signals at the interconnection points shown by the alphabetic characters. In similar manner the equipment to be tested may also be simulated by placing modules of the type shown in FIG. 2 behind the device under test 85 or the patch panel 86 to simulate the signals which would appear at the interconnecting points G through K as explained hereinbefore.

It will be understood that even though the modules generate digital signals for the interconnecting points, it is well known to further generate the information which would be displayed on the individual displays that would correspond to the analog information presented on an actual piece of test equipment. Stated differently since the computer 17 knows which point is connected to the other interconnecting points, the computer can generate the information necessary to provide the actual information on the individual displays.

What is claimed is:

1. A system for sensing a state of interconnection points, comprising:
   a simulator or device having a plurality of interconnection points to be sensed in electrical context with other points in the system,
   multiple interconnection sensing module means having a plurality of interconnection points for coupling to said simulator or device,
   a transmitter/receiver in said module means for each interconnection point to be sensed,
   means for generating a unique address at each transmitter/receiver during a unique time period,
   logic control means having input means coupled to each receiver of each transmitter/receiver for sensing said state of each receiver at said unique time periods,
   encoder means having input means coupled to said logic control means for generating interconnection information at its output indicative of connection between pairs of said interconnection points,
   buffer means coupled to said output of said encoder means for receiving said interconnection information comprising receiver/transmitter address information,
   gating means having an input coupled to said output of said encoder means and an output coupled to said buffer means, and
   computing means coupled to said buffer means for receiving said unique addresses of said receivers and said transmitter thereby determining said status of a connection between any interconnection point and any other interconnection point in real time.

2. A system as set forth in claim 1 wherein said logic control means further comprises first constraining means for limiting said output of said receivers of said transmitter/receivers to pulses which occur after the unique time period of its associated transmitter.

3. A system is set forth in claim 2 wherein said logic control means further comprises second constraining means for limiting said output of said receivers to a first connection status between interconnection points to eliminate redundancy.

4. A system is set forth in claim 3 which further includes third constraining means coupled between said encoder means and said buffer means for determining any changes between said connection status of interconnection points previously sensed.

5. A system as set forth in claim 1 wherein said logic control means further comprises real ground means for detecting if said output of said receiver of each transmitter/receiver returns to its high state after its unique time period.

6. A system is set forth in claim 2 wherein said logic control means further comprises latch means coupled to an output of said first constraining means for setting a latch employing the output of each receiver of said transmitter/receiver, and
   means for scanning said latches to determine if a latch is not set which is indicative of a condition that the interconnection point of the receiver is not connected to any other interconnection point.

7. A system as set forth in claim 1 wherein said multiple interconnect sensing module means comprises a plurality of individual modules each of which is sequenced in a unique time period for each of the transmitter/receivers.

8. A system for sensing the state of interconnection points as set forth in claim 1 wherein the plurality of individual transmitter/receivers are representative of interconnection points in excess of 2,000 interconnection points.

9. A system as set forth in claim 1 wherein said number of transmitter/receivers representative of interconnection points is in excess of 32,000, and
   a master clock having a frequency in excess of 1 mega hertz for scanning all 32,000 interconnection points within a time period of approximately 1/40th of a second.

10. A system as set forth in claim 1 wherein said buffer means is coupled to the output of said encoder of each module and further coupled to a CPU for synchronizing sensed information to said CPU.

11. A system as set forth in claim 10 wherein said gating means comprises a RAM memory coupled to said encoder, a comparator coupled to said RAM memory and said address generating means, and a logic gate coupled to the output of said comparator for enabling said buffer means to receive said address information.

12. A system as set forth in claim 1 wherein said simulator comprises a simulated device under test, a simulated piece of test equipment and simulated patch panel.

13. A system as set forth in claim 12 wherein said simulated device under test comprises a cable, harness or printed circuit board having a plurality of physical interconnection points to be identified and tested.

14. A system for sensing a state of interconnection points, comprising:

a simulator or device having a plurality of interconnection points to be sensed in electrical context with other points in the system, multiple interconnection sensing module means having a plurality of interconnection points for coupling to said simulator or device, a transmitter/receiver in said module means for each interconnection point to be sensed, means for generating a unique address at each transmitter/receiver during a unique time period, logic control means having input means coupled to each receivers of each transmitter/receiver for sensing said state of each receiver at said unique time periods, said logic control means further comprising first constraining means for limiting said sensed state of said receivers of said transmitter/receivers to pulses which occur after said unique time period of its associated transmitter, encoder means having input means coupled to said logic control means for generating interconnection information at its output indicative of connection between pairs of said interconnection points, buffer means coupled to said output of said encoder means for receiving said interconnection information comprising receiver/transmitter address information, gating means having an input coupled to said output of said encoder means and an output coupled to said buffer means, and computing means coupled to said buffer means for receiving said unique addresses of said receivers and said transmitter thereby determining status of a connection between any interconnection point and any other interconnection points in real time.

* * * * *